United States Patent [19]
Leifer et al.

[11] Patent Number: 6,011,395
[45] Date of Patent: Jan. 4, 2000

[54] SHIELDED DRIVE FOR BALANCED QUADRATURE BIRD CAGE COIL

[75] Inventors: Mark C. Leifer, Fremont; Spencer C. Hartman, Millbrae, both of Calif.

[73] Assignee: Varian, Inc., Palo Alto, Calif.

[21] Appl. No.: 08/989,207

[22] Filed: Dec. 11, 1997

[51] Int. Cl.$^7$ ................................................. G01V 3/00
[52] U.S. Cl. .................................... 324/318; 324/322
[58] Field of Search ................................ 324/318, 322, 324/300, 306, 307, 309

[56] References Cited

U.S. PATENT DOCUMENTS

| | | | |
|---|---|---|---|
| 4,638,253 | 1/1987 | Jaskolski et al. | 324/318 |
| 4,752,736 | 6/1988 | Arakawa et al. | 324/318 |
| 4,783,629 | 11/1988 | Arakawa et al. | 324/322 |
| 4,887,039 | 12/1989 | Roemer et al. | 324/322 |
| 5,243,286 | 9/1993 | Rzedzian et al. | 324/318 |

OTHER PUBLICATIONS

Article by Hayes et al., entitled "An Efficient, Highly Homogeneous Radiofrequency Coil for Whole–Body NMR Imaging at 1.5 T," published in *Journal of Magnetic Resonance* in 1985, in vol. 63, pp. 622–628.

Article by James Tropp, entitled "The Theory of the Bird-–Cage Resonator," published in *Journal of Magnetic Resonance* in 1989, in vol. 82, pp. 51–62.

Article by Pascone et al., entitled "Generalized Electrical Analysis of Low–Pass and High–Pass Birdcage Resonators," published in *Magnetic Resonance Imaging* in 1991, in vol. 9, pp. 395–408.

Article by Peter M. Joseph and Dongfeng Lu, entitled "A Technique for Double Resonant Operation of Birdcage Imaging Coils," published in *IEEE Transactions on Medical Imaging* in Sep. 1989, in vol. 8, No. 3., pp. 286–294.

Article by Mark C. Leifer, entitled "Resonant Modes of the Birdcage Coil," published in *Journal of Magnetic Resonance* in 1997, in vol. 124, pp. 51–60.

*Primary Examiner*—Louis Arana
*Attorney, Agent, or Firm*—Edward H. Berkowitz

[57] ABSTRACT

A birdcage coil is operated in a balanced mode through connection of signal ground to a shield surrounding the coil. The driven leg of the coil includes tune capacitors, through which balance is maintained.

14 Claims, 4 Drawing Sheets

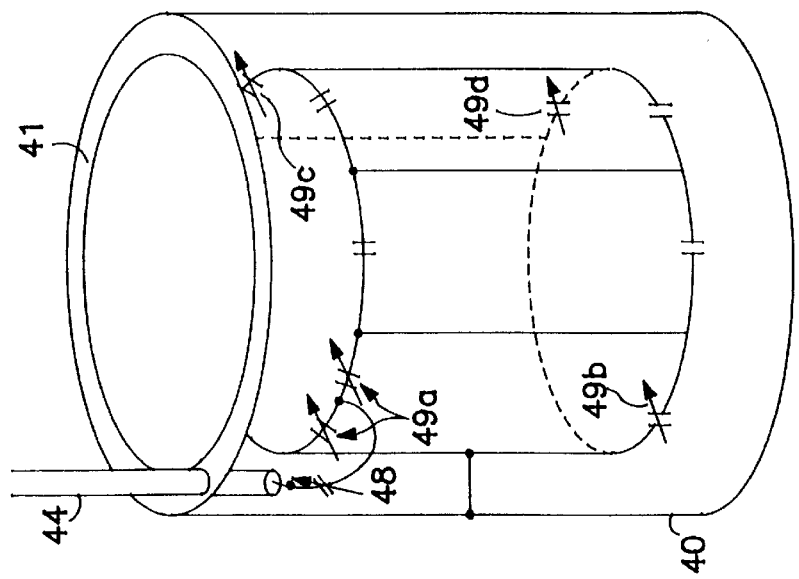
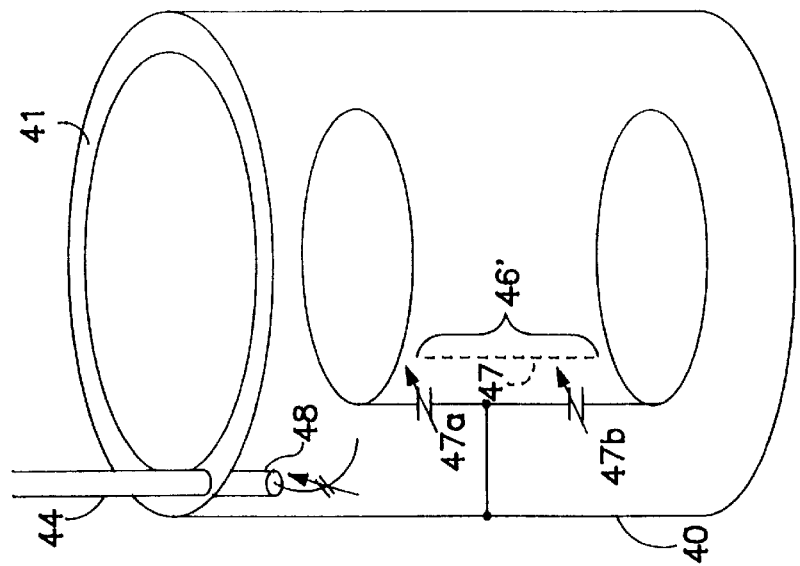
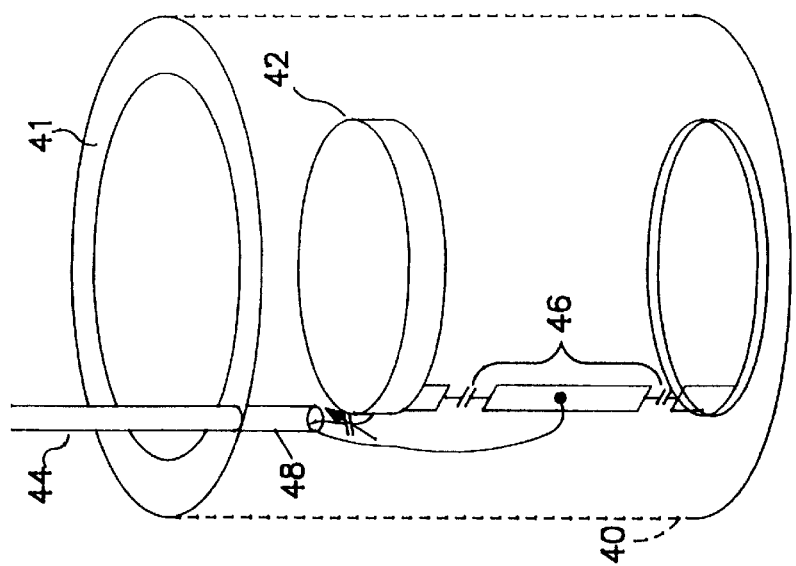

SHIELDED DRIVE FOR BALANCED QUADRATURE BIRD CAGE COIL

FIELD OF THE INVENTION

The invention is in the field of nuclear magnetic resonance apparatus and pertains particularly to rf coils of the bird cage type for the excitation and observation of resonance.

BACKGROUND OF THE INVENTION

In the practice of magnetic resonance phenomena, the application of rf radiation to a sample and the pick up of resulting resonant signal is accomplished in a structure surrounding the sample which may be a helical coil, saddle coil, resonant cavity, or a bird cage resonator. The latter structure is the object of the present work, wherein it is desired to obtain resonant frequencies in a bird cage type structure to facilitate studies of diverse chemical constituents and/or spatial distributions of such constituents which may be appropriate to the sample. A bird cage coil is frequently described as a ladder circuit, which closes on itself, wherein the current flow down the coil is distributed sinusoidally around it. It is often asserted that the bird cage coil is essentially a transmission line. As a tuned rf circuit, it is employed in nuclear magnetic resonance apparatus for either or both of the functions of rf excitation and signal detection.

The bird cage coil differs in essential manner from saddle coils, helices and like structures in that phase shifts are employed to provide the proper current distribution. For the bird cage coil, there is a requirement that the phase shift be discretely distributed around the circumference of the coil from zero to $2\pi$ (or $2\pi k$, where the mode number, k, is an integer). The phase shift of each element is quite frequency dependent and as a consequence, the bird cage coil is tuned at a discrete frequency to achieve the desired phase shift constraint. It is desirable to achieve a quadrature driven bird cage coil in order to maximize power efficiency upon transmission and signal-to-noise ratio during signal reception.

The bird cage coil is particularly well suited to large volume samples as are routinely encountered with apparatus for medical imaging and in vivo analytic spectroscopy. Bird cage coils are discussed by Hayes et al, J. Mag. Res., vol. 63, pp. 622–628 (1985); Tropp, J. Mag. Res., vol. 82, pp.51–62 (1989); Pascone, et al, Mag. Res. Imaging, vol. 9, pp395–408 (1991); Joseph and Lu, IEEE Tr. Med. Imaging, vol. 8 pp.386–394 (1989); Leifer, J. Mag. Res., vol. 124, pp51–60 (1997).

The bird cage structure may be regarded as a periodic structure which closes on itself. Periodic elements of the structure produce phase shifts which must aggregate to some integer multiple of $2\pi$ when summed over the closed loop. Geometrically, the resonator has cylindrical symmetry and it is desired that the if current in the axial direction along the periphery of the structure be proportional to $\sin k\theta$ and/or $\cos k\theta$ where $\theta$ is the azimuthal angle about the cylindrical axis.

In the prior art, a balanced bird cage coil is driven (or signal derived) by coupling the signal ground to the midpoint of one (reactive) leg and the signal lead is suitably coupled to one end of the leg.

This prior art includes a birdcage coil having N=4n legs (where n is an integer) operated in balanced quadrature mode by coupling the signal ground of the Q signal to the electrical midpoint of a first leg and the Q signal lead to the annulus proximate to the end of that first leg while the I signal ground is coupled to the electrical midpoint of a second leg and the I signal lead is coupled to the annulus proximate to the end of the second lead, where the first and second legs are relatively phase shifted by $\pi/2$. This prior art is described in U.S. Ser. No. 08/768,037, incorporated herein by reference.

Although the occurrence of parasitic currents on the outer conductor of the coaxial cable driving the prior art balanced birdcage coil is reduced, there remains an inherent interaction of the balanced coil with the coax outer conductor by capacitive and radiative coupling.

BRIEF DESCRIPTION OF THE INVENTION

In the present invention a balanced birdcage coil includes a conducting shield surrounding the coil and extending axially beyond the coil by an amount sufficient to achieve satisfactory reduction of interaction of the coil to its near environment and to the cable(s) connecting to it. The cable signal ground(s) are connected to the shield.

In a further embodiment, a driven leg of the birdcage coil incorporates a pair of symmetrically arranged capacitors adapted for the purpose of tuning the birdcage structure while maintaining symmetry about the coil midplane. These capacitors may be tuned independently or ganged for concurrent tuning.

In yet another embodiment, the current flow or potential between the driven leg and the shield may be monitored to determine the extent of any deviation from proper balance, such deviation remedied by the differential adjustment of said tuning capacitors.

BRIEF DESCRIPTION OF THE DRAWINGS

FIG. 2a illustrates in partial schematic, a prior art balanced low pass birdcage coil.

FIG. 2b shows in partial schematic, a balanced low pass birdcage coil with shielded drive of the present invention.

FIG. 2c shows in partial schematic, a balanced high pass birdcage coil of the present invention.

FIG. 3b is an end view of the arrangement of FIG. 3a.

DETAILED DESCRIPTION OF THE APPARATUS

The physical context of the invention is an NMR apparatus. An idealized illustration is shown in FIG. 1.

A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil 12 in the interior of bore 11. Resonant signals are induced in a receiver coil, proximate the sample within bore 11. The transmitter and receiver coils may be the identical structure, or separate structures.

Figure 1:
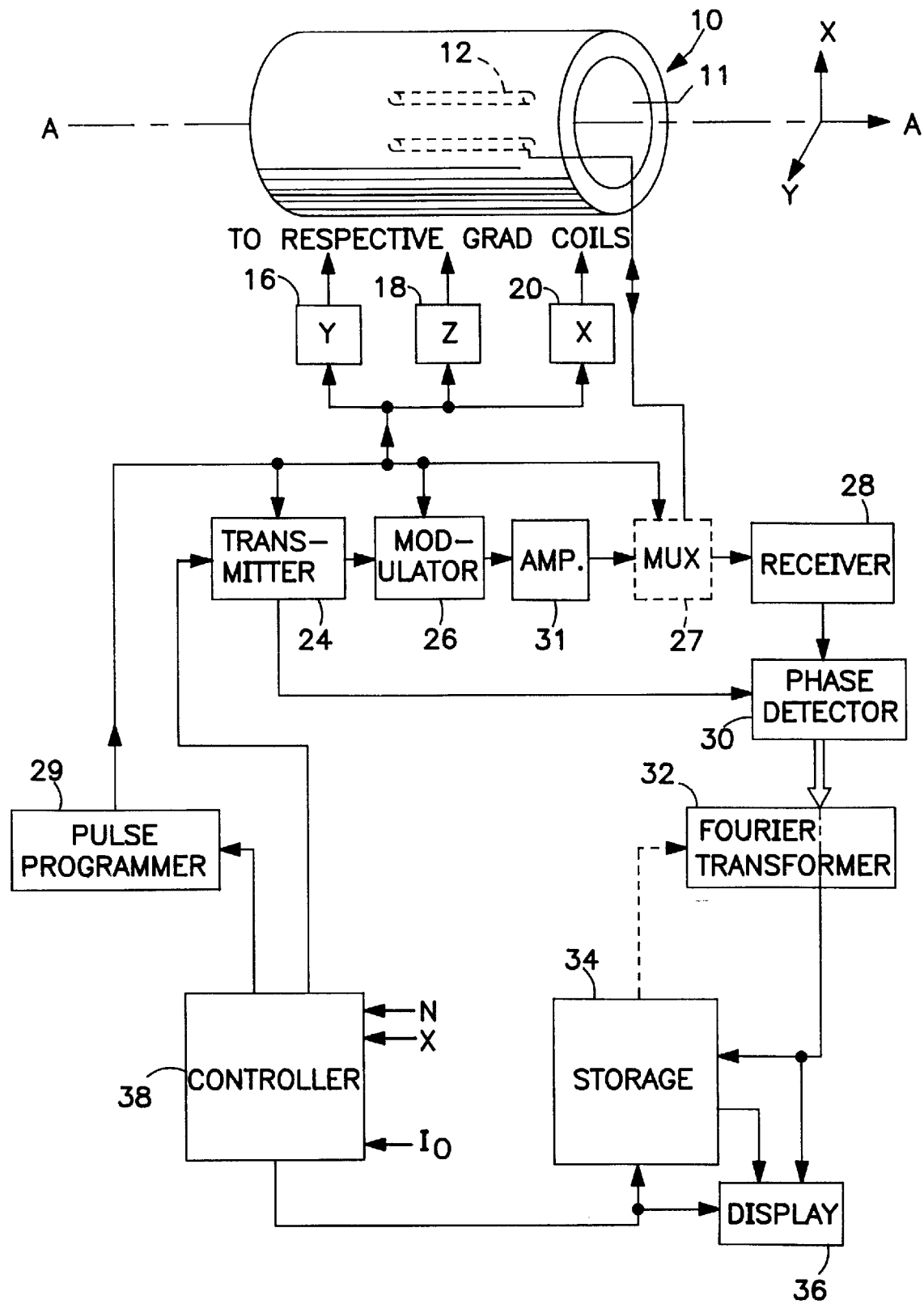
FIG. 1 is a schematic illustration for the context of the invention.

As shown in FIG. 1, rf power is provided from transmitter 24, which may be modulated in amplitude or frequency or phase or combination thereof, either upon generation or by modulator 26, is amplified by amplifier 31 and thence directed via multiplexer 27 to the rf transmitter coil 12 located within bore 11. Transmitter and receiver coils are usually not concurrently used as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide rf pulses of desired amplitude, duration and phase relative to the rf carrier at preselected time intervals. The pulse programmer may have hardware and/or software attributes. The pulse programmer also controls the gradient power supplies 16, 18 and 20, if such gradients are required. These gradient power supplies may maintain selected static gradients in the respective gradient coils if so desired.

The transient nuclear resonance wave form is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved wave forms to enhance the signal-to-noise ratio. The transformation function is then applied to the resultant averaged wave form. Display device 36 operates on the acquired data to present same for inspection. Controller 38, most often comprising one or more computers, controls and correlates the operation of the entire apparatus. The birdcage coil is a well known rf resonant structure for achieving a homogeneous rf field in which to immerse an object for study. The birdcage coil is effectively described as a ladder circuit or transmission line which closes on itself wherein the current flow around the circuit is distributed sinusoidally. The birdcage structure may be regarded as a periodic structure over which the rf phase shift (which must aggregate to $2\pi k$) is distributed. The birdcage resonator is most commonly realized in cylindrical geometry and is most commonly operated in the k=1 mode which produces a maximally uniform transverse field within the sample volume, but the present invention applies equally to operation in higher order modes.

Birdcage coils operating in quadrature mode operation require realization of phase shifts in discrete increments aggregating $\pi/2$ between the driven legs. In the case that quadrature operation is not practiced, the number of legs need not be constrained to multiples of four.

As mentioned above, parasitic currents on the outer conductor of a coax cable connecting the birdcage coil with the rest of the apparatus are reduced by the prior art coil of U.S. Ser. No. 768,037. The present invention supplies further improvement in reduction of the "cable mode" effects wherein the outer conductor of the coaxial cable is susceptible to potentials impressed thereon by the radiation field of the coil. In particular, the present invention is applicable to any symmetrical birdcage coil, whether low pass, high pass, band pass or band reject in design.

FIGS. 2a and 2b compare the prior art (U.S. Ser. No. 08/768,037) and the invention respectively. Similar components bear identical labels and slightly differing components are labeled with a prime superscript. Outer cylinder 40, with end face(s) 41, is the shield assembly and has an outer diameter, an inner diameter and is preferably constructed of a convenient nonconductor with one or more slotted shields, conductive coatings or foil (e.g. copper) jackets in a continuous or broken but overlapping pattern. The inner diameter is selected to provide appropriate clearance for the birdcage coil structure 42. A driving signal is communicated to coil 42 via coaxial cable 44. In the prior art, the cable is led whole into the interior of the shield and the outer braid is soldered to the driven leg. By contrast, in the present invention the coaxial cable is routed along the interior of the RF shield with the outer conductor grounded to the shield by soldered connection 48 or equivalent. The coaxial cable protrudes far enough into the shielded region for the center conductor to attach through the capacitor coupling to the driven leg.

Figure 3A:
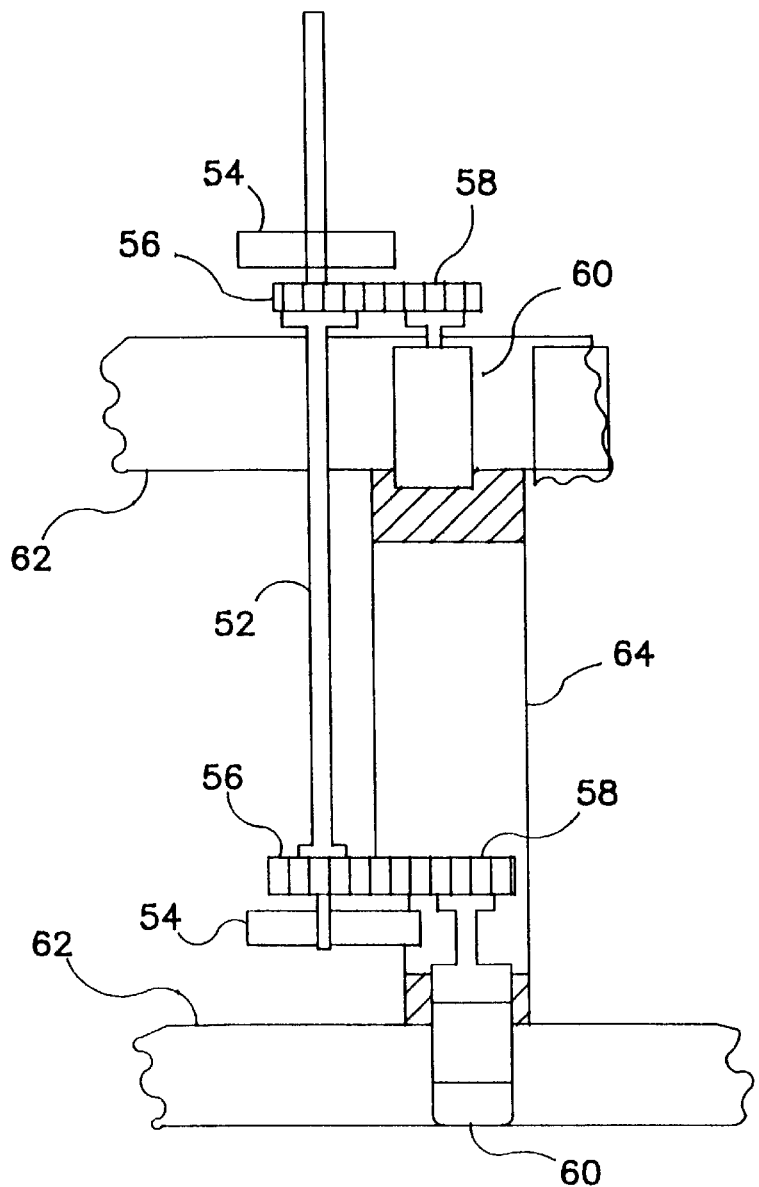
FIG. 3a shows a representative arrangement for ganging the tuning capacitors of a driven leg.
Figure 3B:
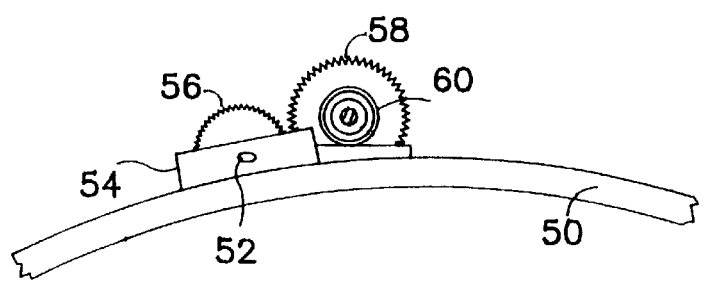

It is also a feature of the present invention that capacitors 46' are ganged (47) to maintain balance in the coil during tuning operations. One preferred embodiment gangs (47) capacitors 46' as is shown in FIGS. 3a and 3b for the low pass example. An insulating shaft 52 is supported by insulating pillow blocks 54 which are disposed on the cylindrical coil form 50. Gears 56, attached to shaft 52 engage gears 58, which latter are fixed to the movable element(s) of respective capacitors 60. The ganged capacitors are shown in relationship to coil end rings 62 and driven leg 64. Multiple pairs of capacitors on legs distributed around the coil perimeter and ganged with gears or belts may be used to further improve the azimuthal symmetry of the coil. Other tuning schemes may be employed, such as the use of metallic sleeves to change the coil inductance while maintaining symmetry and balance.

FIG. 2c illustrates the invention in the context of a high pass birdcage coil. It is worth remarking that the capacitor to be ganged here include the three capacitors 49a and 49b, or alternatively, the two capacitors 49c and 49d disposed at 180° from the drive point.

For purposes of testing, a 200 MHz coil of the above referenced prior art was selected. This coil featured an 8 leg, quadrature driven, low pass design implemented on an (a=) 8.26 cm radius form with a coaxial shield of (b=) 10.48 cm outer radius. The coil end ring axial separation (center-to-center) was 15.9 cm and both legs and end rings were 2.54 cm wide. The axial length of the conductive shield was varied to investigate the incremental effect of shield length on the interaction of the coil with the coaxial cable outer conductor.

Performance of the shielded coil of the present invention is best parameterized for comparison by measurement of the Q for each of the quadrature driven inputs as a function of the axial extension of the shield. Additionally, the frequency shift $\Delta f$ in each case is noted when the system (in some base operational mode) is perturbed by manually grasping the coaxial cables. The axial extension of the shield is expressed in relation to the separation of the coil and shield (b-a), and the extension $z_0$ measured from the centerline of the end ring. These results are summarized in table 1 (prior art) and table 2. The results for table 2 were obtained after modifying the prior art coil in accord with the invention. Firmly grasping the cables simply provided a convenient basis for illustrating the cable modes of the prior art coil. The undisturbed resonance frequency $f_1$, of one of the two quadrature channels is also listed for reference.

TABLE 1

| | $Q_1$ | $Q_2$ | $S_{21}$ | $\Delta f_1$ | $\Delta f_2$ |
|---|---|---|---|---|---|
| Base | 172 | 166 | −12 dB | | |
| Grasp Cables | not measurable | not measurable | −8 | 0.2 MHz | 0.4 MHz |

TABLE 2

| $z_0$ | $z_0/(b-a)$ | $Q_1$ | $Q_2$ | $S_{21}$ | $f_1$ | $\Delta f_2$ |
|---|---|---|---|---|---|---|
| 2.80 cm | 1.26 | 220 | 240 | −10 dB | 199.26 MHz | 0.25 MHz |
| 4.45 | 2.00 | 280 | 300 | −15 | 199.57 | 0.15 |
| 6.52 | 2.57 | 300 | 310 | −17 | 199.71 | 0.12 |
| 7.00 | 3.14 | 310 | 315 | −19 | 199.80 | 0.05 |
| 8.26 | 3.71 | 300 | 315 | −20 | 199.83 | 0.05 |
| 9.53 | 4.29 | n/a | n/a | n/a | 199.84 | |

For $z_0/(b-a)$ of about 2.5 or more, the results are excellent.

As the shield is extended beyond the end of the coil, the radiation field of the coil decays to levels such that significant potentials are not impressed upon the provided shield of the coaxial cables. It is advantageous to shield end face 41 to provide a radial continuation of the cylindrical portion of the shield 40. This is effective in reducing impressed potentials, such that the overall shield (axial) extension may be made shorter. In the present invention, the geometry of the cable attachment to the coil and shield is particularly adapted to reduction of cable modes.

A conductor disposed between the shield and the midpoint of a driven leg is optimal. In another embodiment, this conductor may include an RF current sensor to provide indication of departure from a balanced condition. Balance is restored by independent (unganged) adjustment of one of the capacitors 47a or 47b relative to the other. In an alternative embodiment, this connection may be made at a leg other than the driven one, or at multiple legs, inasmuch as the midpoints of all legs are nominally at the same potential due to the balanced nature of the design. Because this potential is also nominally the same as that of the shield, this connection is omitted. On yet another embodiment the potential between the shield and the leg midpoint may be used to indicate balance in such case.

The shielded drive invention may be repeated at a leg $\pi/2$ in phase away in order to drive a second channel for the purpose of producing circularly polarized magnetic fields within the coil, or at additional legs at one or more different frequencies in the case of a multiply resonant coil.

Figure 4:
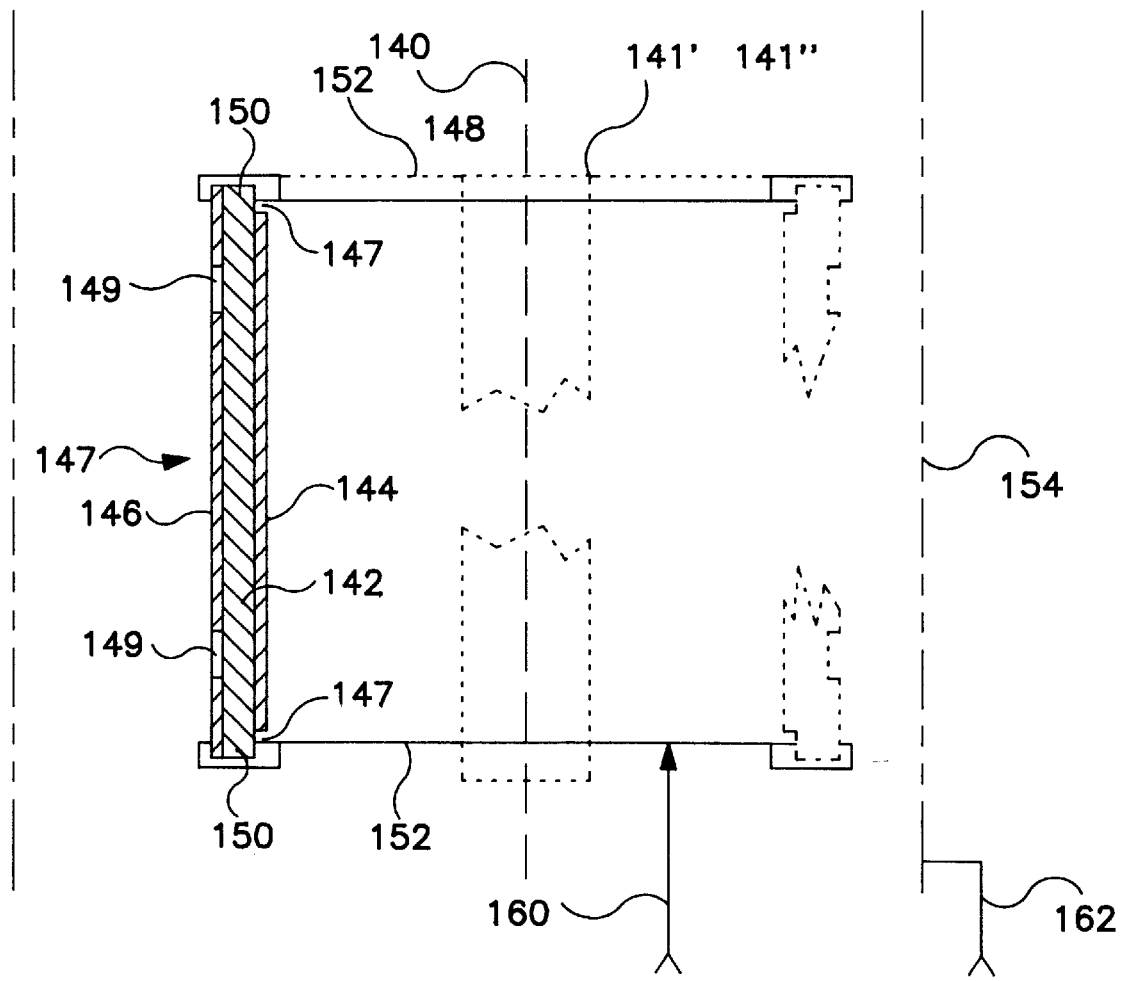
FIG. 4 shows the structure of leg conductors.

Turning now to FIG. 4 there is shown a realization of the birdcage coil of the invention in half section. Spaced from axis 140 and parallel therewith are a plurality of leg conductors 141, 141', 141" etc. A leg conductor 141 is substantially planar and extended in structure comprising a dielectric core 142 having conductive surfaces 144 and 146 on opposite sides. The surface 144 faces the interior volume defined by the leg conductors and the axis. The end portions 147 of these conductive surfaces are removed. The opposite surface 146 has an inner portion 149 removed which is distal with respect to the end regions 150. A pair of annular conductors are disposed about axis 140 and 15, 152' are coupled to said leg conductors 141, 141', 141" etc. at respective ends thereof. A shield 154 is provided surrounding the coil. An RF signal lead is provided for connection to the annular conductor 152 and RF ground is connected to the shield.

All changes, modifications, variations and other uses and applications which do not depart from the spirit and scope of the invention are deemed to be covered by the invention which is limited only by the claims.

What is claimed is:

1. In a balanced bird cage coil for providing a substantially uniform RF field in the cylindrical interior space thereof, comprising:
    a plurality of leg conductors disposed spaced from an axis and parallel therewith, said plurality of leg conductors defining an active volume, each said leg conductor comprising a reactive impedance;
    a pair of annular conductors disposed about said axis and coupled to adjacent said leg conductors at respective ends thereof;
    an RF access port comprising an RF signal lead communicating with said annular conductor and an RF signal ground lead at the midpoint of a selected said leg conductor, the improvement comprising;
    a conductive shield spaced radially outward from said leg conductors, said shield extending axially beyond said leg conductors,
    said RF signal ground lead proximate to and connected to said shield.

2. The balanced bird cage coil of claim 1 wherein said selected leg conductor comprises a pair of capacitive reactances symmetrically disposed axially on said leg about the midpoint thereof.

3. The balanced bird cage coil of claim 2 wherein said capacitive reactances are capable of selective variation in the capacitance thereof.

4. The balanced bird cage coil of claim 3 wherein said capacitive reactances are varied concurrently.

5. The balanced bird cage coil of claim 4 wherein said capacitive reactances are constrained to be varied non-independently.

6. The balanced bird cage coil of claim 1 wherein said shield is electrically connected to at least one said leg at the axial midpoint thereof.

7. The balanced bird cage coil of claim 6 wherein said electrical connection is effectuated through a device capable of indicating a potential difference between said shield and said axial midpoint of said at least one selected leg.

8. The birdcage coil of claim 1 further comprising matching means for coupling an RF power source of selected impedance to said bird cage coil.

9. A balanced low pass quadrature driven bird cage coil for providing a substantially uniform RF field in the cylindrical interior space thereof, comprising:
    4n leg conductors, n being an integer, each said leg disposed spaced from an axis and parallel therewith, said plurality of leg conductors defining an active volume, each said leg conductor having a midpoint and comprising capacitive and inductive impedance;
    a pair of annular conductors disposed about said axis and coupled to adjacent said leg conductors at respective ends thereof through respective capacitive reactances;
    a conductive shield disposed coaxially with said bird cage coil and extending axially beyond said annular conductors;

a first RF access port comprising a signal lead and a signal ground lead, said signal lead coupled to one said annular conductor proximate a first leg and a second RF access port comprising a second RF signal lead and second RF signal ground, said second RF signal lead coupled to said annular conductor proximate a second leg spaced by n legs from said first leg; and a first RF access port signal ground coupled to said shield whereby said first and second legs are phase displaced by $\pi/2$ in phase and a virtual ground occurs at said midpoint.

10. A balanced high pass quadrature driven bird cage coil for providing a substantially uniform RF field in the cylindrical interior space thereof and a distribution of RF phase along the periphery thereof, comprising:

4n leg conductors, each said leg disposed spaced from an axis and parallel therewith, said plurality of leg conductors defining an active volume, n being an integer, each said leg conductor having a midpoint and comprising an inductive impedance;

a pair of annular conductors disposed about said axis and coupled to adjacent said leg conductors at respective ends thereof, said annular conductors further comprising 4n annular capacitances disposed intermediate said couplings with said leg conductors, a first and second said annular capacitance each comprising at least a pair of capacitors;

a first RF access port comprising first RF signal lead and first RF signal ground, said first RF signal lead coupled to one said annular conductor intermediate said pair of capacitors of said first capacitance and a second RF access port comprising a second RF signal lead and second RF signal ground, said second RF signal lead coupled to said annular conductor intermediate said pair of capacitors of said second capacitance, said first and second RF access ports spaced by a phase difference of $\pi/2$ of said phase distribution along said annular conductor; and first RF access port signal grounds coupled to said shield whereby said first and second legs are phase displaced by $\pi/2$ in phase and a virtual ground occurs at said midpoint.

11. The birdcage coil of claim 7 wherein said first and second RF signal grounds are at the same potential.

12. A balanced band pass quadrature driven bird cage coil for providing a substantially uniform RF field in the cylindrical interior space thereof and a distribution of RF phase along the periphery thereof, comprising:

4n leg conductors, each said leg disposed spaced from an axis and parallel therewith, said plurality of leg conductors defining an active volume, n being an integer, each said leg conductor having a midpoint and comprising a capacitive and an inductive impedance;

a pair of annular conductors disposed about said axis and coupled to adjacent said leg conductors at respective ends thereof, said annular conductors further comprising 4n annular capacitances disposed intermediate said couplings with said leg conductors, a first and second said annular capacitance each comprising at least a pair of capacitors;

a first RF access port comprising first RF signal lead and first RF signal ground, said first RF signal lead coupled to one said annular conductor intermediate said pair of capacitors of said first capacitance and a second RF access port comprising a second RF signal lead and second RF signal ground, said second RF signal lead coupled to said annular conductor intermediate said pair of capacitors of said second capacitance, said first and second RF access ports spaced by a phase difference of $\pi/2$ of said phase distribution along said annular conductor, first and second RF access port signal grounds coupled to said shield whereby said first and second legs are phase displaced by $\pi/2$ in phase and a virtual ground occurs at said midpoint.

13. The birdcage coil of claim 12 wherein said first and second RF signal grounds are at the same potential.

14. A bird cage coil for providing a substantially uniform RF field in the cylindrical interior space thereof, comprising:

a plurality of leg conductors disposed spaced from an axis and parallel therewith, said plurality of leg conductors defining an active volume, each said leg conductor comprising a substantially planar and extended member comprising a dielectric core having conductive surfaces on opposite substantially planar sides thereof, a first conductive surface disposed facing said interior space and a second conductive surface having at least an inner portion removed from said substrate, said inner portion distal in respect to end regions of said extended dielectric member, and end portions removed from said first conductive surface whereby said first and second surfaces are not co-extensive in said end regions;

a pair of annular conductors disposed about said axis and coupled to adjacent said leg conductors at respective ends thereof;

an RF access port comprising an RF signal lead connected to said annular conductor and an RF signal ground lead connected to a shield.

* * * * *